United States Patent
Meulen

(10) Patent No.: US 8,424,703 B2
(45) Date of Patent: Apr. 23, 2013

(54) SUBSTRATE CONTAINER SEALING VIA MOVABLE MAGNETS

(75) Inventor: Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 691 days.

(21) Appl. No.: 12/434,330

(22) Filed: May 1, 2009

(65) Prior Publication Data

US 2009/0272743 A1   Nov. 5, 2009

Related U.S. Application Data

(63) Continuation-in-part of application No. 12/131,024, filed on May 30, 2008.

(60) Provisional application No. 61/049,440, filed on May 1, 2008, provisional application No. 61/057,170, filed on May 29, 2008.

(51) Int. Cl.
| | | |
|---|---|---|
| B65D 51/00 | (2006.01) | |
| B65D 43/26 | (2006.01) | |
| B65D 88/44 | (2006.01) | |
| B60R 25/00 | (2006.01) | |
| A47G 19/22 | (2006.01) | |

(52) U.S. Cl.
USPC ........... 220/230; 220/262; 220/710; 220/223; 70/253

(58) Field of Classification Search .................. 206/1.5, 206/454, 455, 711, 710, 818; 220/230; 292/44, 292/46, 52, 54; 70/103, 108, 109, 113–116
See application file for complete search history.

(56) References Cited

U.S. PATENT DOCUMENTS

| | | | |
|---|---|---|---|
| 3,157,302 A | | 1/1964 | Hakim |
| 3,615,006 A | | 10/1971 | Freed |
| 3,953,061 A | * | 4/1976 | Hansen et al. ..................... 292/5 |
| 4,154,070 A | * | 5/1979 | Bahry et al. ................... 70/108 |
| 4,300,674 A | * | 11/1981 | Davet ............................. 206/6.1 |
| 4,470,277 A | * | 9/1984 | Uyeda ............................ 70/118 |

(Continued)

FOREIGN PATENT DOCUMENTS

| | | |
|---|---|---|
| JP | 06-151266 | 5/1994 |
| JP | 09-134952 | 5/1997 |
| JP | 11-163116 | 6/1999 |
| KR | 10-2003-0065275 | 8/2003 |

*Primary Examiner* — J. Gregory Pickett
*Assistant Examiner* — Kaushikkumar Desai
(74) *Attorney, Agent, or Firm* — Perman & Green, LLP; Colin C. Durham

(57) ABSTRACT

A system of moving magnets for sealing a container may include a plurality of moveable magnets disposed near a perimeter of a container door and a rotatable linkage hub positioned within the perimeter of the container door. In addition, the system may include a plurality of control linkages connecting each of the plurality of moveable magnets to the linkage hub so that rotating the linkage hub causes the control linkages to move the moveable magnets between a sealed position and an open position. Alternatively, the moveable magnets may be connected to each other by a magnet positioning mechanism to physically move the magnets along a path near the perimeter. A plurality of static magnets may be disposed near an opening sized to receive the container door and positioned to form a magnetic seal with the moveable magnets when the moveable magnets are positioned at the sealed position.

18 Claims, 14 Drawing Sheets

U.S. PATENT DOCUMENTS

| | | | |
|---|---|---|---|
| 4,540,326 A | 9/1985 | Southworth et al. | |
| 4,687,542 A | 8/1987 | Davis et al. | |
| 4,724,874 A | 2/1988 | Parikh et al. | |
| 4,995,430 A | 2/1991 | Bonora et al. | |
| 5,399,531 A | 3/1995 | Wu | |
| 5,730,573 A | 3/1998 | Masujima et al. | |
| 5,931,512 A * | 8/1999 | Fan et al. | 292/66 |
| 5,976,199 A | 11/1999 | Wu et al. | |
| 6,230,895 B1 | 5/2001 | Laube | |
| 6,281,510 B1 | 8/2001 | Yoshitake et al. | |
| 6,336,567 B1 * | 1/2002 | Hyobu | 220/230 |
| 6,360,943 B1 | 3/2002 | Focke et al. | |
| 6,491,177 B1 * | 12/2002 | Hyobu | 220/4.01 |
| 6,622,883 B1 * | 9/2003 | Wu et al. | 220/323 |
| 6,646,720 B2 | 11/2003 | Ramamoorthy et al. | |
| 6,906,783 B2 | 6/2005 | del Puerto et al. | |
| 6,955,382 B2 * | 10/2005 | Eggum | 292/116 |
| 6,991,416 B2 | 1/2006 | del Puerto et al. | |
| 7,123,344 B2 | 10/2006 | Van De Ven et al. | |
| 7,151,589 B2 | 12/2006 | Ham et al. | |
| 7,549,552 B2 * | 6/2009 | Hasegawa et al. | 220/323 |
| 7,905,960 B2 | 3/2011 | Choi et al. | |
| 2002/0074635 A1 | 6/2002 | Hattori et al. | |
| 2003/0227605 A1 | 12/2003 | del Puerto et al. | |
| 2004/0129699 A1 | 7/2004 | Williams | |
| 2005/0098463 A1 * | 5/2005 | Belden et al. | 206/387.11 |
| 2005/0286029 A1 | 12/2005 | Ham et al. | |
| 2006/0081488 A1 * | 4/2006 | Lax et al. | 206/308.2 |
| 2006/0108252 A1 * | 5/2006 | Lax | 206/470 |
| 2007/0261979 A1 | 11/2007 | Ordonez et al. | |
| 2007/0269293 A1 | 11/2007 | Yu et al. | |
| 2008/0080963 A1 * | 4/2008 | Bufano et al. | 414/788 |

* cited by examiner

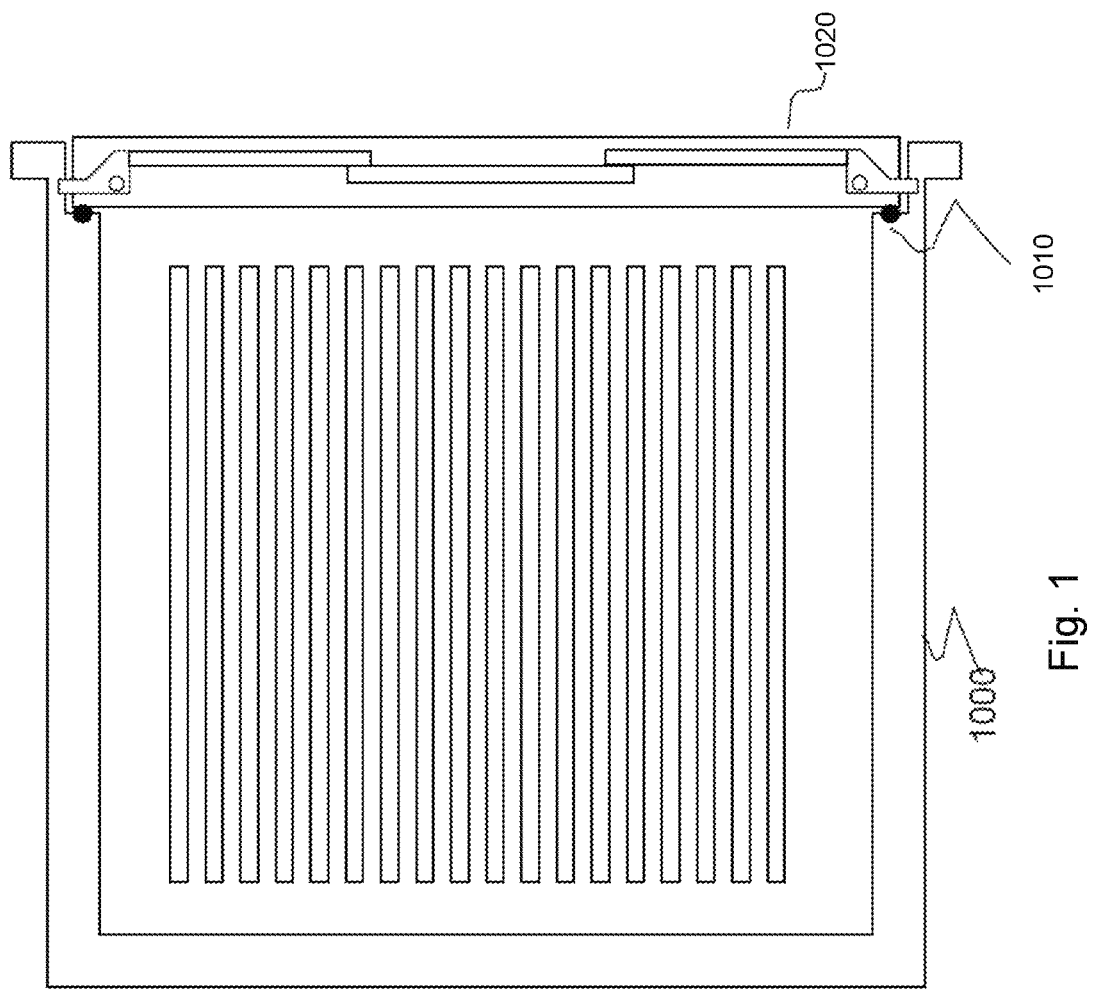

SUBSTRATE CONTAINER SEALING VIA MOVABLE MAGNETS

CROSS-REFERENCE TO RELATED APPLICATIONS

This application claims the benefit of the following provisional applications, each of which is hereby incorporated by reference in its entirety:

U.S. Provisional Application Ser. No. 61/049,440 filed May 1, 2008 and U.S. Provisional Application Ser. No. 61/057,170 filed May 29, 2008.

This application is a continuation-in-part of U.S. application Ser. No. 12/131,024 filed May 30, 2008 which is hereby incorporated by reference in its entirety.

BACKGROUND

1. Field

The methods and systems disclosed herein relate to magnetically sealable substrate containers.

2. Description of the Related Art

Currently, standards for the semiconductor industry describe mechanically sealing boxes (Front Opening Unified Pods—FOUPs, SEMI E47.1, E57). While techniques are generally known for mechanically operating seals, a mechanical seal has a number of disadvantages. The physical mechanisms for sealing can generate particles where latches engage. It is also difficult to achieve a uniform seal on a mechanically secured door, and any force transmission can damage the weakest part of a transmission chain. While magnetic seals have been proposed to avoid some of these disadvantages, there remains a need for controllable magnetic seals for substrate containers.

SUMMARY

A substrate container may provide an air-tight enclosure for storing or transporting substrates. The environment of the substrate container may include a vacuum atmosphere, an air atmosphere, an inert gas atmosphere (e.g. Argon or Nitrogen), and the like. An arrangement of moveable magnets in a door of the container and corresponding magnets or magnetically attractive elements in the container body may facilitate securing the container door to the container body to enable the air-tight seal.

In an aspect of the invention, methods and systems for sealing a container include a plurality of moveable magnets disposed near a perimeter of a container door; a linkage hub positioned within the perimeter of the container door; and a plurality of control linkages connecting each of the plurality of moveable magnets to the linkage hub so that operating the linkage hub causes the control linkages to move the moveable magnets between a sealed position and an open position. In the aspect, operating the linkage hub comprises rotating the linkage hub. Further in the aspect, rotating the linkage hub clockwise causes the moveable magnets to move to the sealed position. Also, rotating the linkage hub counter-clockwise may cause the moveable magnets to move to the open position.

In the aspect, the system for sealing a container is sealed within the container door.

Further in the aspect, the linkage hub is magnetically attractive. The methods and systems may also include a magnet for positioning over the rotatable linkage hub and for operating the linkage hub via magnetic attraction of the magnet to the hub.

In the aspect, the moveable magnets are disposed to provide an evenly distributed sealing force when the moveable magnets are positioned in the sealed position.

The aspect may further include at least one return spring positioned to return the moveable magnets to the sealed position. The return spring acts on at least one of the plurality of magnets or the linkage hub.

In another aspect of the invention, methods and systems may include a plurality of moveable magnets disposed near a perimeter of a container door; a magnet positioning mechanism connecting to each of the magnets to control movement of the magnets in relation to a sealing position; a container with an opening shaped to receive the door thereby closing the opening; and a plurality of magnetically attractive elements disposed near the opening and positioned to form a magnetic seal with the moveable magnets when the moveable magnets are positioned at the sealing position.

In the aspect, the magnet positioning mechanism includes a linkage hub connected to the plurality of moveable magnets with linkages. The magnet positioning mechanism may include a rotating hub for moving the moveable magnets to the sealed position in response to a clockwise rotation of the rotating hub. The magnet positioning mechanism may include a rotating hub for moving the moveable magnets from the sealed position in response to a counter-clockwise rotation of the rotating hub.

In the aspect, the system sealing a container is sealed within the container door.

Also, in the aspect, the moveable magnets are disposed to provide an evenly distributed sealing force when the moveable magnets are positioned in the sealed position.

In yet another aspect of the invention, methods and systems for magnetically sealing a substrate container may include connecting a plurality of moveable magnets with a mechanism for simultaneously moving the moveable magnets among a sealed position, a neutral position, and an opened position, wherein neighboring moveable magnets have opposing magnetism; positioning a plurality of static magnets to align with each of the moveable magnets when the moveable magnets are in one of the sealed position and the opened position, wherein the static magnets attract the moveable magnets when they are moved to the sealed position and the static magnets repel the moveable magnets when they are moved to the opened position; positioning a first portion of the substrate container that includes the moveable magnets against a second portion of the substrate container that includes the static magnets to form a closed container; and actuating the mechanism to move the moveable magnets to the sealed position. The aspect may further include unsealing the substrate container by actuating the mechanism to move the moveable magnets to the neutral position. The aspect may further include opening the substrate container by actuating the mechanism to move the moveable magnets to the opened position. In the aspect, opening the substrate container is facilitated by the static magnets repelling the moveable magnets.

In yet another aspect of the invention, methods and systems may include a plurality of first magnets disposed near a perimeter of a container door; a plurality of electromagnets disposed near a perimeter of a container door counteracting each of the first magnets to physically cancel the magnetic force of the first magnets; a container with an opening shaped to receive the door thereby sealing the opening; and a plurality of static magnets or magnetic material disposed near the opening and positioned to align with the first magnets, wherein each static magnet or magnetic material is next to an opposing first magnet. In the aspect, a power supply may activate the electromagnets in order to remove the container door.

In yet another aspect of the invention, methods and systems may include at least one moveable magnet disposed near each edge of a container door; a plurality of mechanical springs connecting the moveable magnets to the container door, the springs for positioning the moveable magnets in a sealing position; a magnet positioning mechanism connecting to each of the moveable magnets to facilitate opposing the plurality of springs thereby moving the magnets from the sealing position; a container with an opening shaped to receive the door thereby sealing the opening; and at least one magnetically attractive element disposed near each edge of the opening and positioned to form a magnetic seal with the moveable magnets when the moveable magnets are positioned at the sealing position. In the aspect, the magnet positioning mechanism controls the movement of the magnets between the sealing position and an open position.

In yet another aspect of the invention, methods and systems may include a plurality of magnets moveably disposed near a perimeter of a container door, wherein each magnet is next to an opposing magnet; a magnet positioning mechanism connecting each of the magnets to physically move the magnets along a path near the perimeter; a container with an opening shaped to receive the door thereby sealing the opening; and a plurality of static magnets disposed near the opening and positioned to align with the moveable magnets, wherein each static magnet is next to an opposing magnet. In the aspect, the magnet position mechanism includes a chain to connect each of the magnets and a gear train engaged with the chain to move the magnets.

In yet another aspect of the invention, methods and systems may include accessing an interior of a substrate container that may include a five sided body forming a container with an opening sized to accept a top for sealing an interior of the sealed container; a gasket for sealing the top to the body to form an air-tight seal; a pressure sensitive membrane in a side of the body for exhausting the interior atmosphere; and an intake membrane in the top separating the interior atmosphere from an exterior environment and for receiving a hollow needle for accessing the interior atmosphere from the exterior environment while maintaining the air-tight seal. In the aspect, the pressure sensitive membrane facilitates exhausting the interior atmosphere to the exterior environment based on an interior atmosphere pressure threshold. In the aspect, the interior atmosphere pressure threshold is based on a difference between the interior atmosphere and the exterior environment.

In the aspect, the hollow needle is further connected to a pressurized gas supply for introducing the gas into the container thereby causing the interior atmosphere to be exhausted through the pressure sensitive membrane so that the interior atmosphere is replaced with the gas. The gas is an inert gas and may be one of air, argon, and nitrogen.

In the aspect, the pressure sensitive membrane allows for small pressure differentials between the interior atmosphere and the exterior environment These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 1 depicts a section view of a substrate container with a mechanically operated seal.

DETAILED DESCRIPTION

FIG. 1 is a side view of a Front Opening Unified Pod ("FOUP") container with a mechanically operated seal. In general the FOUP container 1000 has a gasket 1010 that maintains an air tight seal, and a door latch mechanism that secures a door 1020. Wafers or similar substrates may be stored within the FOUP container 1000.

Figure 2B:
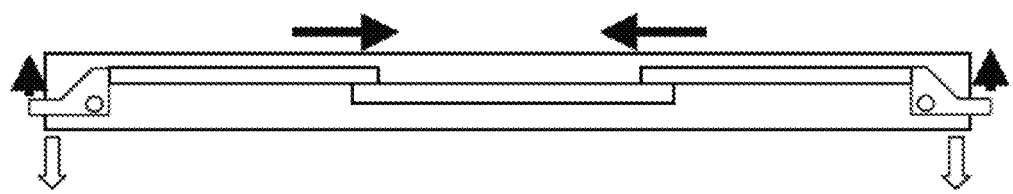
FIG. 2B depicts a section view of a door of the embodiment of FIG. 1 with the mechanically operated seal in a closed or sealed position.
Figure 2A:
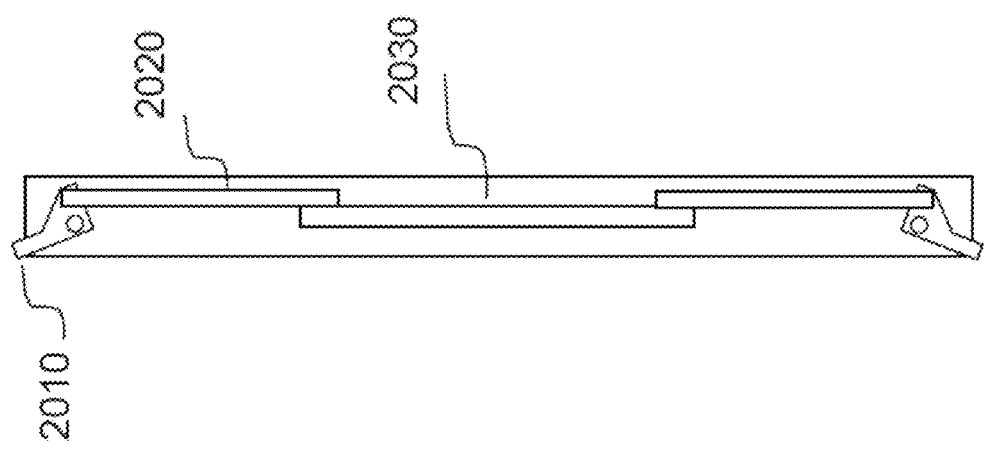
FIG. 2A depicts a section view of a door of the embodiment of FIG. 1 with the mechanically operated seal in an open or unsealed position.

FIG. 2A shows a mechanical door latch in an open position. A seal device 2010 or the like is coupled by a linkage 2020 to an engagement disk 2030 operative to collectively apply a closing force to the door 1020.

FIG. 2B shows the mechanical door latch in a closed position, with applied latch forces and the resulting closing force indicated by arrows.

In general, the various mechanisms for sealing and opening a FOUP door may be activated by application of magnetic force.

Figure 3:
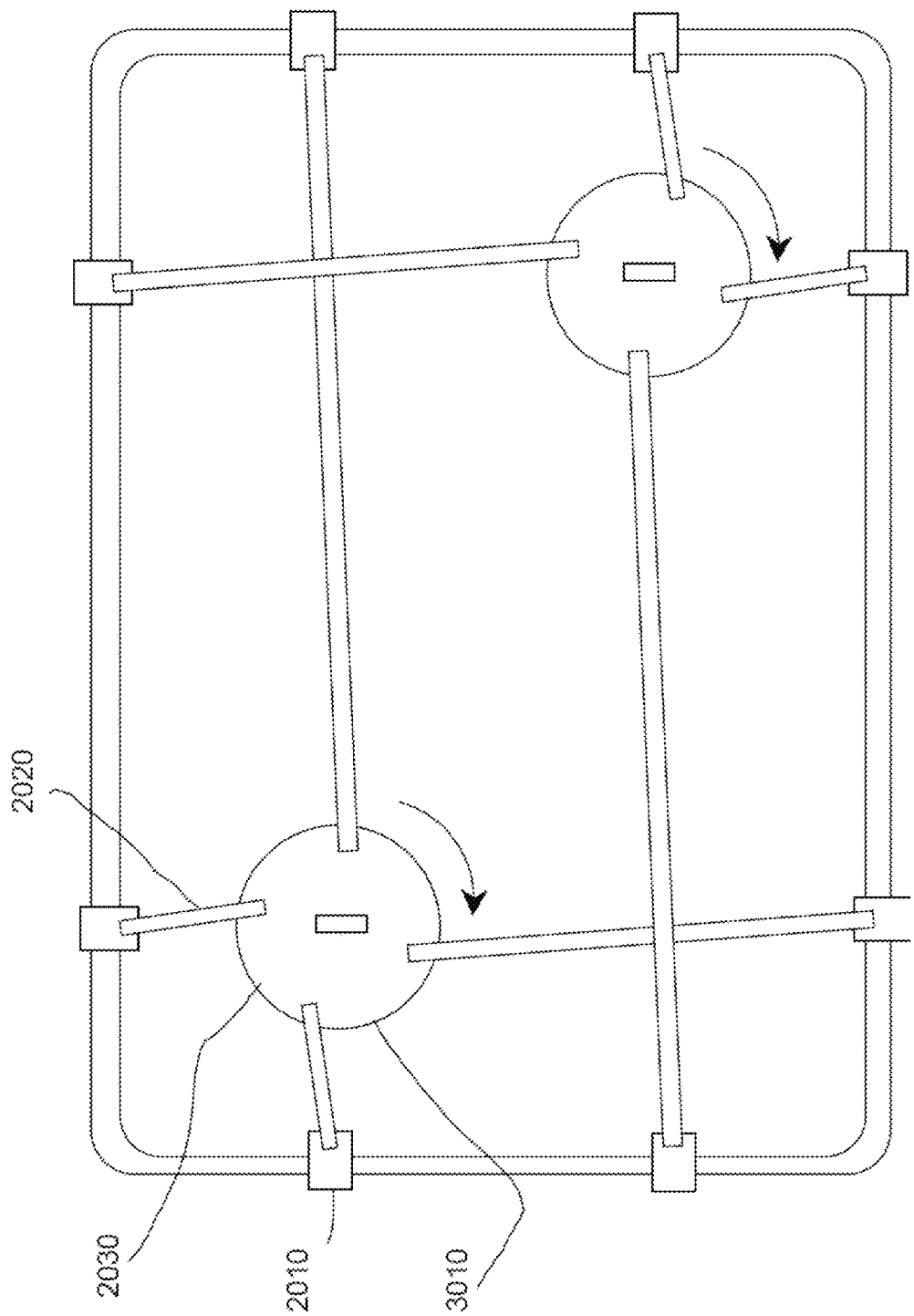
FIG. 3 depicts a top view of a magnetically operated latch.

FIG. 3 shows a magnetically operated latch. A magnet positioning mechanism that may include a linkage hub 3010 and linkages 2020 may provide physical access to the linkage hub 301 to control the linkages 2020 that physically control movement of seal devices 2010. Seal device 2010 may be formed of a magnetic material. By operating the linkage hub 3010, the seal devices 2010 may be moved into and out of position to magnetically seal the door to a FOUP or the like. The magnet positioning mechanism and seal devices 2010 may be enclosed entirely within the door, thus mitigating risks of particle generation/contamination within the FOUP. By distributing a number of magnetic seal devices 2010 about the perimeter of a door, a more constant, evenly distributed closing force can be applied to the door perimeter and consequently to the gasket 1010. Corresponding magnets or magnetically attractive elements within the FOUP around the perimeter of an opening for the door may optionally be employed to provide greater closing force. In embodiments, electrical coils or the like may be positioned about the seal devices 2010 so that local magnetic forces can be temporarily reduced to unseal the door. Although the embodiment of FIG. 3 depicts the magnet positioning mechanism as a hub with linkages, other magnet positioning mechanism, such as electronically controlled motors, mechanical slides, springs, magnetically controlled positioning devices, and the like may be used in place of the hub and linkages.

Figure 4:
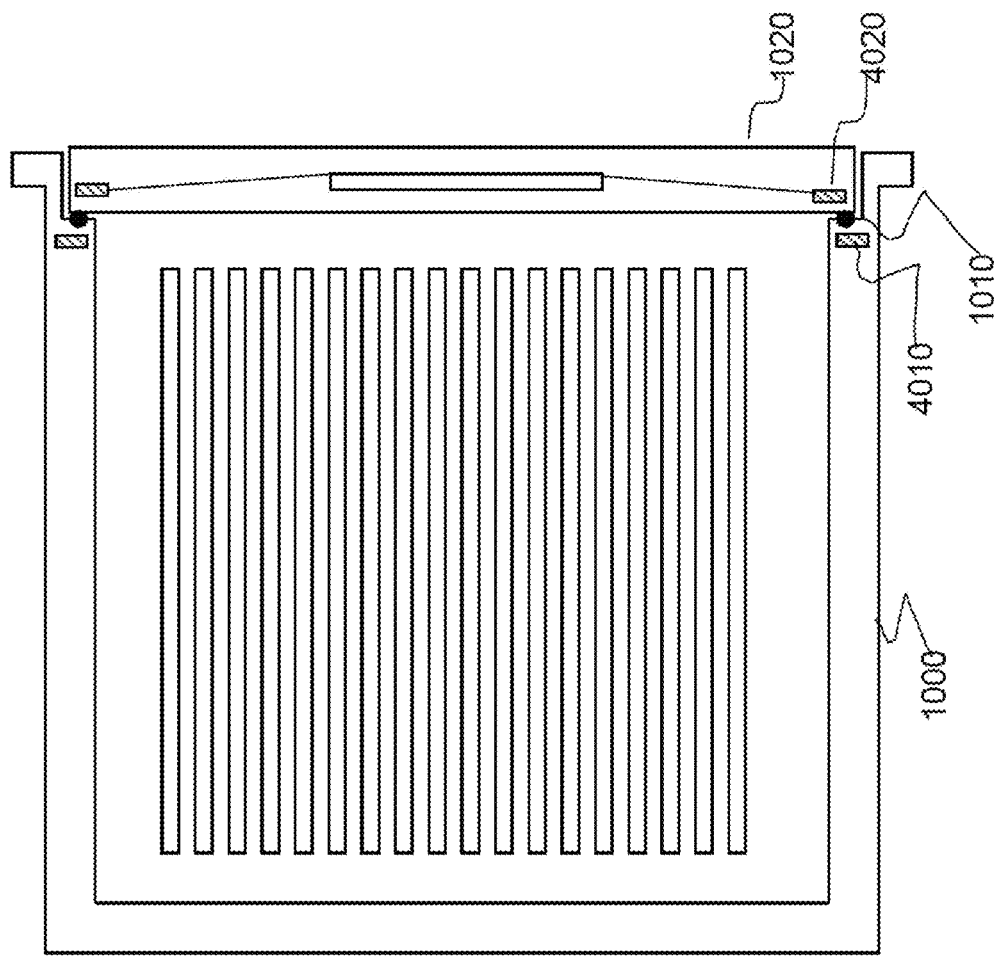
FIG. 4 depicts a section view of a magnetic door seal.

FIG. 4 shows a magnetic door seal. Magnets may be attracted to other magnets or magnetically attractive material such as iron, steel, and the like. In the embodiment of FIG. 4, magnetically attractive elements 4010 within the FOUP 1000 may be positioned along the perimeter of an entrance thereto. Movable magnets 4020 may be provided within the door 1020 in positions that correspond to the magnetically attractive elements 4010. The door 1020 may be configured with any suitable mechanical system to move the movable magnets 4020 into and out of alignment with the magnetically attractive elements 4010 to seal the door 1020 through magnetic attraction of the movable magnets 4020 and the corresponding magnetically attractive elements 4010.

Figure 5B:
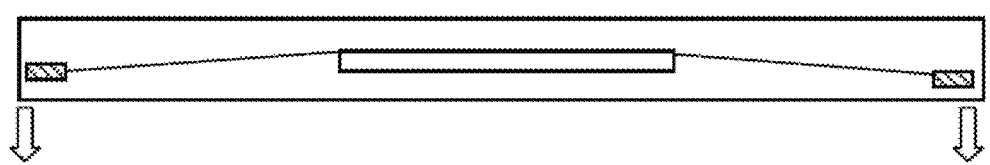
FIG. 5B depicts a section view of a door with magnets in a sealed position.
Figure 5A:
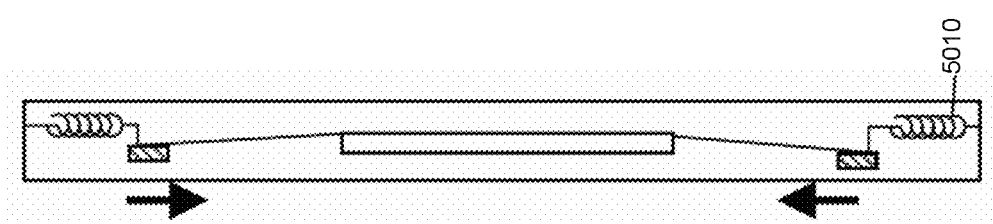
FIG. 5A depicts a section view of a door with spring positioned magnets in an unsealed position.

FIG. 5A shows a door with moveable magnets in an unsealed position. A return spring 5010 or the like may be provided to assist in physical positioning of the magnets 4020.

FIG. 5B shows the door 1020 with magnets in a sealing or closed position. It will be understood that many magnet positioning mechanism including without limitation mechanical, electromechanical, or magneto-mechanical systems may be suitably adapted to move the magnets 4020 into and out of alignment with the magnetically attractive elements 4010 of the FOUP 1000 under user control.

Figure 6:
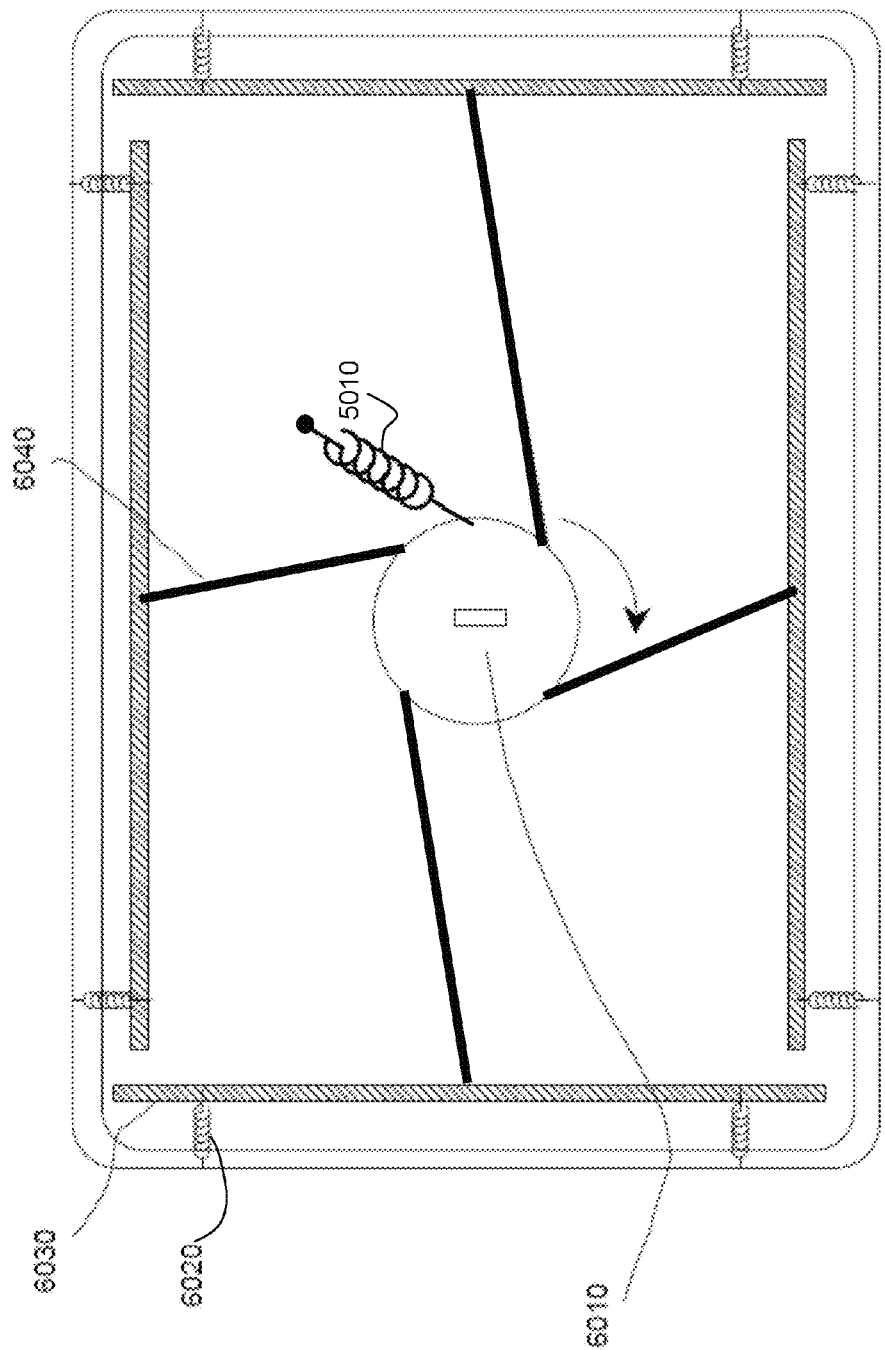
FIG. 6 depicts a mechanism for mechanical actuation of a magnetic door seal.

FIG. 6 shows a mechanical control for magnetically sealing a FOUP door. In this embodiment, a linkage hub 6010 provides access for a user to physically operate the magnetic latch. Return springs 6020 may be provided to draw the magnets 6030 within the door into a position aligned with corresponding magnets (not shown) in a FOUP. Alternatively, return spring 6020 may be positioned to return the linkage hub 6010 to a home location that returns the magnets 6030 to a position aligned for sealing the FOUP. Linkages 6040 may be provided to mechanically couple the linkage hub 6010 and associated hardware to the magnets 6030 to permit movement of the magnets into and out of alignment with the FOUP magnets. It will be understood that, while magnets within the FOUP may be employed to increase the applied force of the magnetic seal, the FOUP may also, or instead, employ non-magnetized materials such as any suitable metal to attract the magnets of the door and provide a closing force to seal the FOUP.

Figure 7:
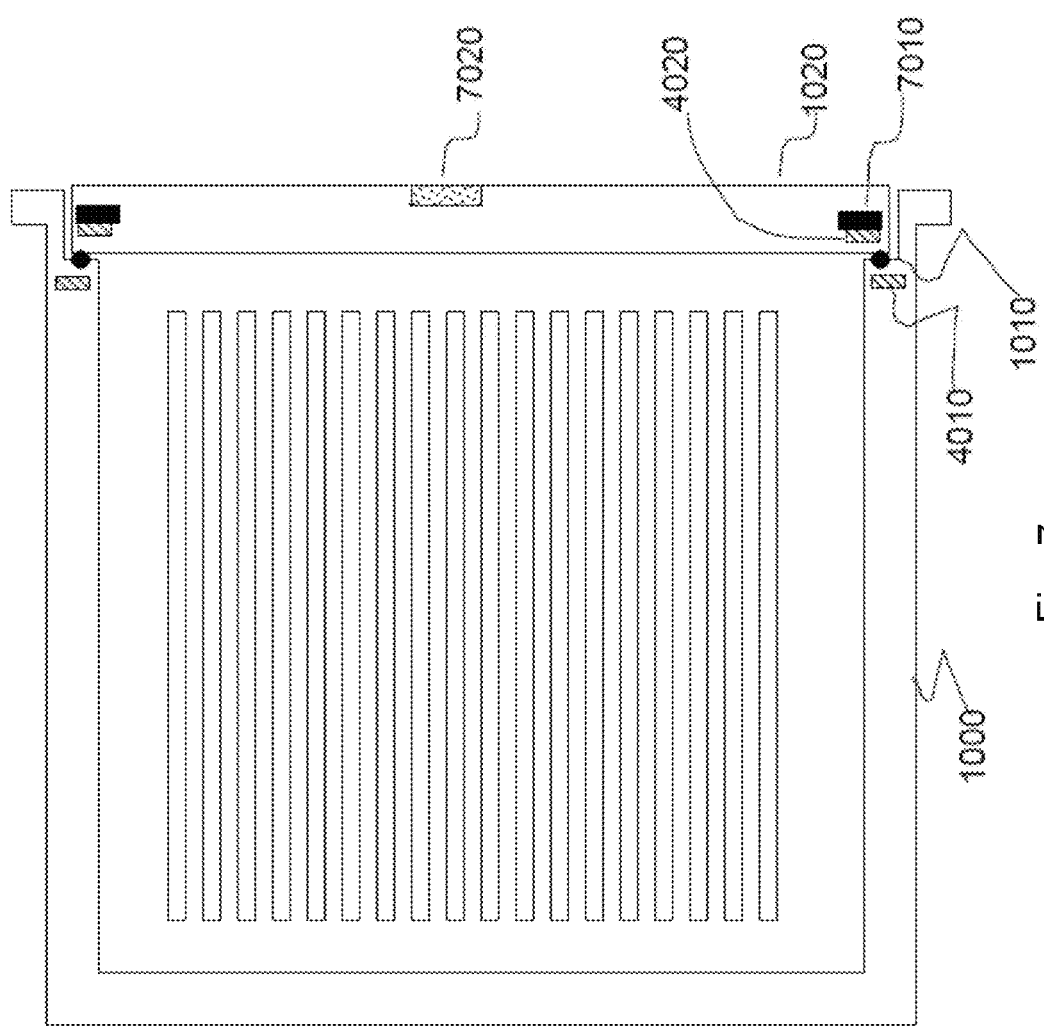
FIG. 7 depicts an electronic control for magnetically sealing a substrate container.

FIG. 7 shows an electrical control for magnetically sealing a FOUP door. In this embodiment, an electrical coil 7010 provides a reverse magnetic field when current is applied through electrical contacts 7020 (wiring to coils not shown), thereby temporarily relieving the closing force of magnets 4020 that have a fixed position within the door 1020.

Figure 8:
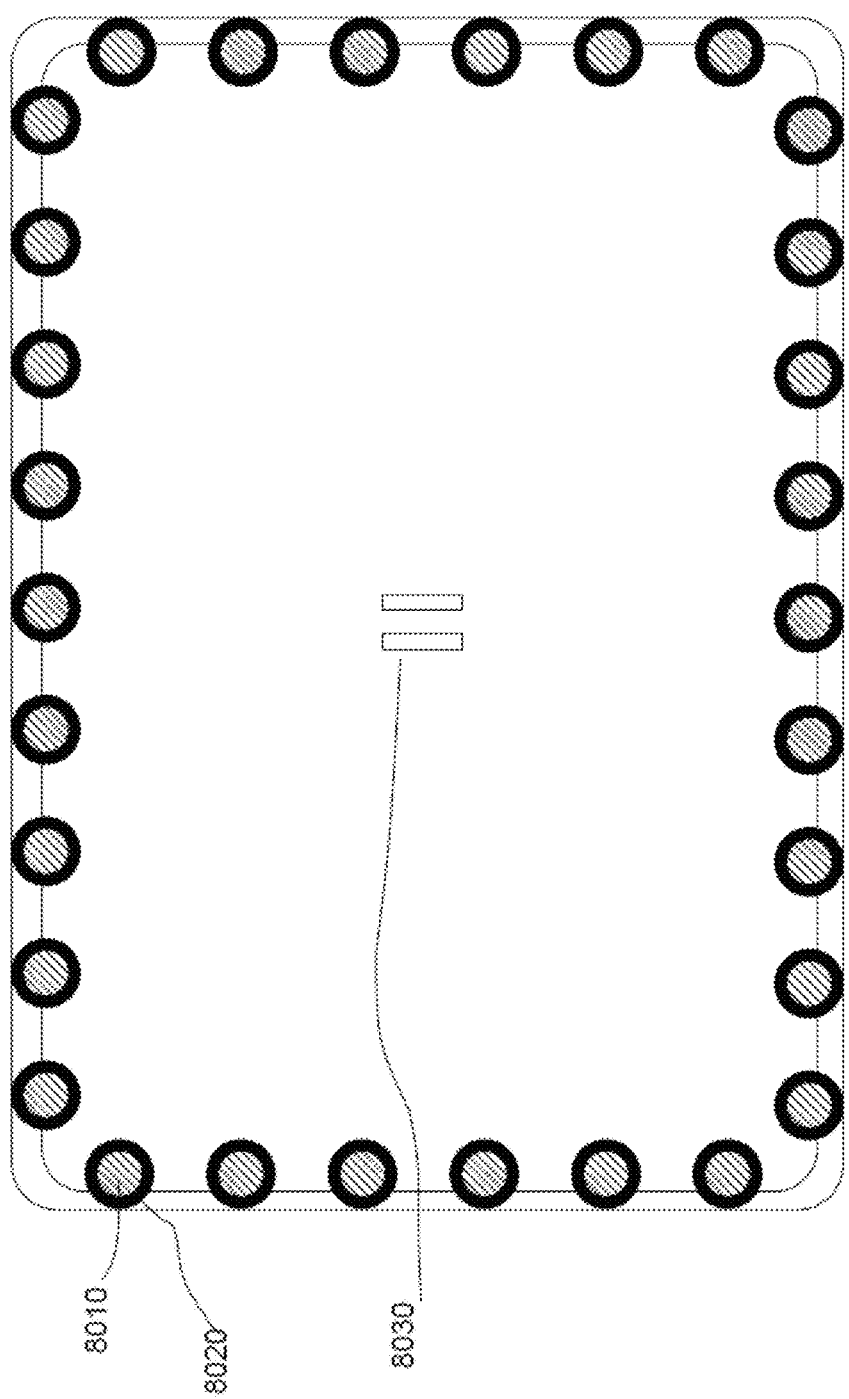
FIG. 8 depicts a top view of an electronically controlled magnetically sealed door of a substrate container.

FIG. 8 shows an electrical control for magnetically sealing a FOUP door. In this embodiment, permanent magnets 8010 may be positioned within or behind electrical coils 8020 that selectively create an opposing magnetic field when current is applied. Each coil 8020 may be wired to contacts 8030 on the door 1020 where a suitable control circuit and current source may be connected to control operation of the coils 8020 to selectively relieve closing force from the permanent magnets 8010. It will be understood that in other embodiments, the coil may create a magnetic field to seal the door, although the desirability of this arrangement may depend on the length of time the door remains sealed in typical usage conditions. It will be understood that a combination of permanent magnets and electromagnets may be used in a suitable arrangement.

Figure 9:
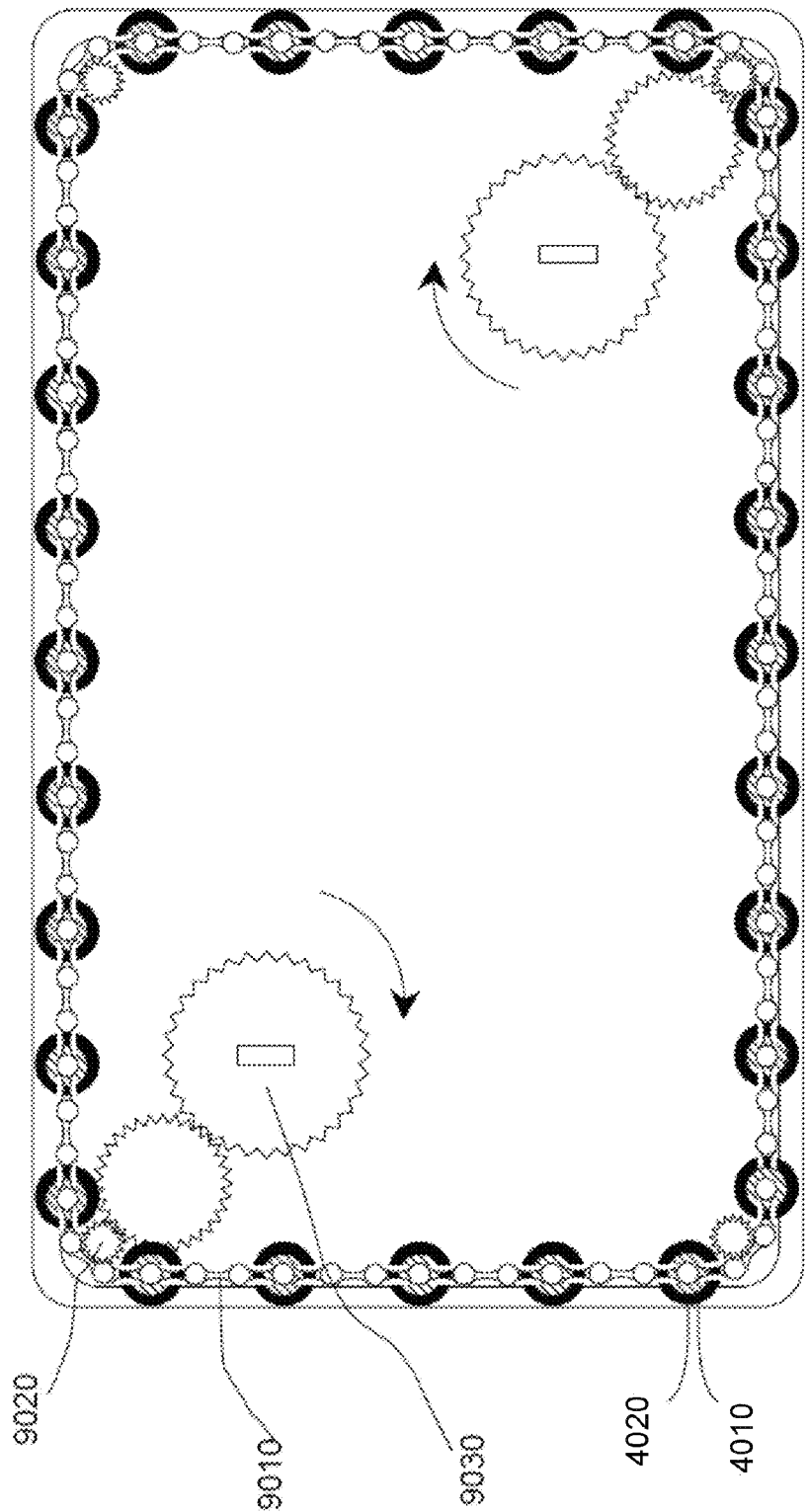
FIG. 9 depicts a top view of a door with moveable magnets for sealing the door to a container.

FIG. 9 shows a magnetically sealed wafer transport container including movable magnets. The movable magnets 4020 may be mounted to a magnet transport 9010, such as a chain, cable, wire, or similar linkable device. The magnet transport 9010 may be mounted inside a box door enclosure. A gear, sheave, pulley, or similar device 9020 may allow the magnet transport 9010 to make a 90-degree turn. A linkage hub and gear train 9030 may drive the chain. The gear 9020 may be part of the gear train 9030. The magnetically attractive elements 4010 may be mounted in the box frame. In some embodiments, the magnetically attractive elements 4010 and the magnets 4020 may be permanent magnets. As shown, the movable magnets 4020 may be positioned over the magnetically attractive elements 4010 resulting in a relatively high net force between the magnetically attractive elements 4010 and the magnets 4020 that holds the door closed.

Figure 10:
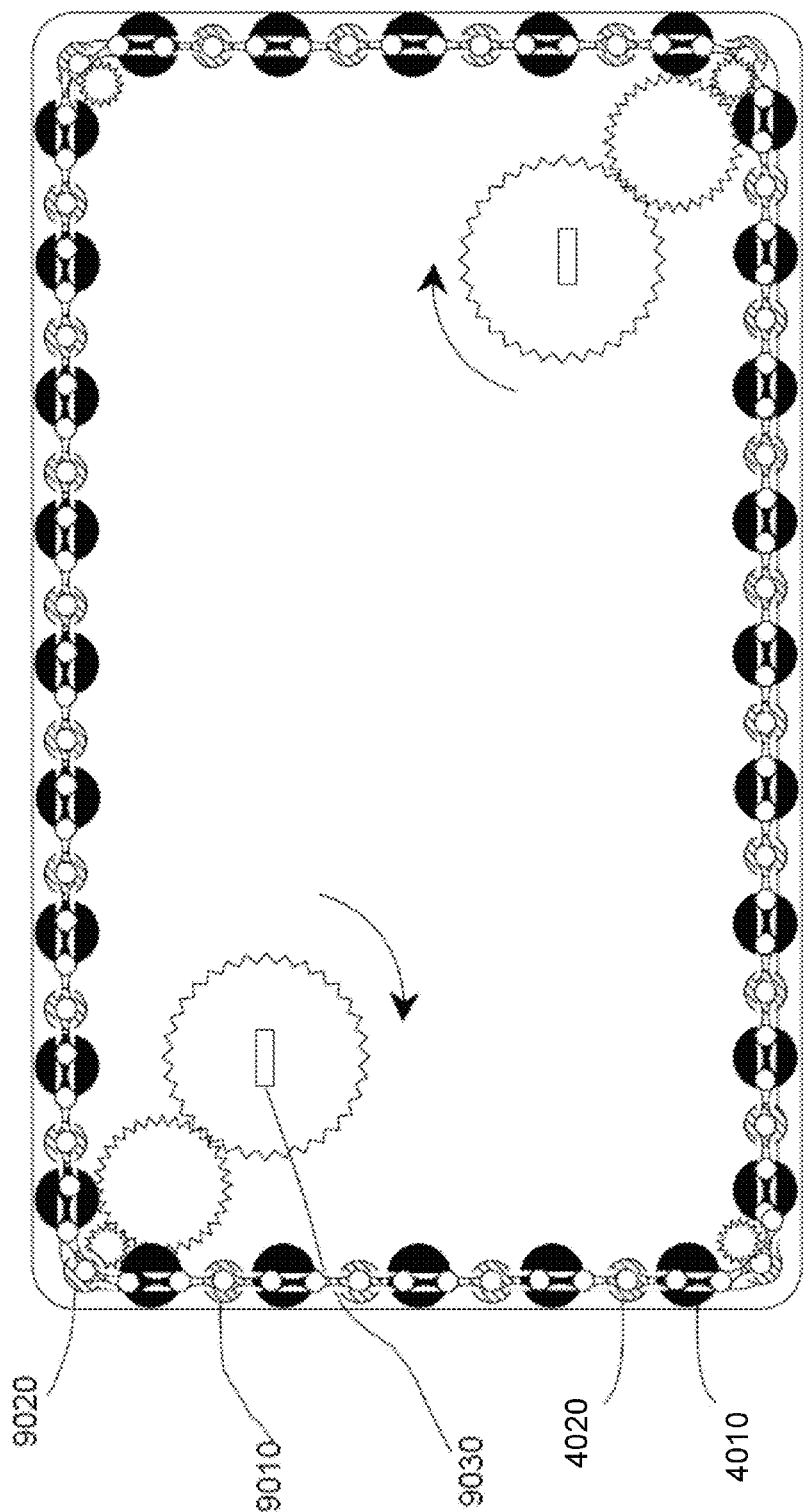
FIG. 10 depicts the embodiment of FIG. 9 with the magnets moved to an alternate position.

FIG. 10 shows a magnetically sealed wafer transport container including movable magnets. The linkage hub 9030 may be rotated into an open position. This rotation may move the chain 9010 so as to position the movable magnets 4020 in a neutral position above gaps between the magnetically attractive elements 4010. This may result in a relatively low net force between the magnetically attractive elements 4010 and the magnets 4020 that allows the door to be opened.

Figure 11A:
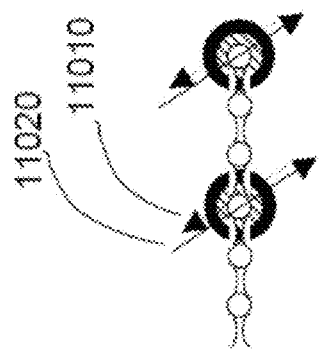
FIG. 11A depicts aligned magnets from the embodiment of FIG. 9.
Figure 11B:
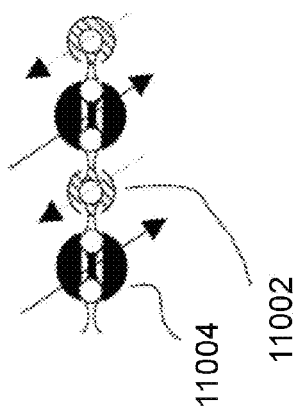
FIG. 11B depicts non-aligned magnets from the embodiment of FIG. 10.

FIGS. 11A and 11B show magnets from a door of a magnetically sealed wafer transport container. The magnetic direction 11020 of the movable magnets 11002 may be oriented in a first direction. The magnetic direction 11010 of the static magnets 11004 may be oriented in a second direction. The first direction may be substantially opposite the second direction so that aligning the moveable magnets 11002 and the static magnets 11004 may result in a relatively high net force between the magnets 11002 and 11004 that seals the door. When the magnets 11002 are moved to a non-aligned or neutral position relative to the static magnets 11004 as shown in FIG. 11B, there may result a relatively low net force between the magnets 11002 and 11004 that allows the door to be opened.

Figure 12A:
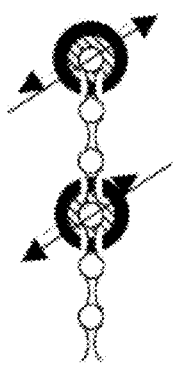
FIG. 12A depicts aligned attracting magnets.
Figure 12B:
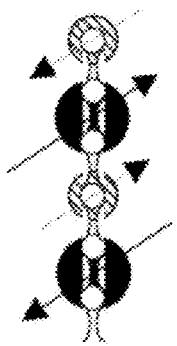
FIG. 12B depicts non-aligned magnets.
Figure 12C:
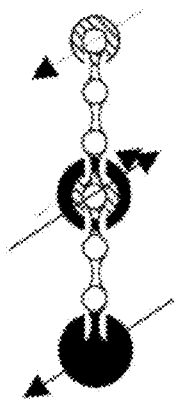
FIG. 12C depicts aligned opposing magnets.

FIGS. 12A, 12B, and 12C show magnets from a door of a magnetically sealed wafer transport container. The movable magnets 11002 may be oriented in alternating, opposite directions 12020. The static magnets 11004 may be oriented in alternating, opposite directions 12010. Rotation of the gear 9020 may position the movable magnets 11002 to produce the depicted arrangements.

In FIG. 12A, the movable magnets 11002 may be positioned over the static magnets 11004 and the coinciding directions 12020, 12010 may be substantially opposite each other. In this configuration, a relatively high net force between the magnets 11002 and 11004 may hold the door closed.

In FIG. 12B, the movable magnets 11002 may be above the gaps between the static magnets 11004 in a neutral position, resulting in a relatively low net force between the magnets 11002 and 11004 that allows the door to be opened.

In FIG. 12C the movable magnets 11002 may be moved over the static magnets 11004 and the coinciding directions 12020, 12010 may be substantially the same as each other. In this configuration, an opposing force between the magnets 11002 and 11004 may assist in opening the door.

Current FOUPs are manufactured out of plastics. Wafers in the FOUP are exposed to air, which can have an impact on wafer surface conditions. Water vapor can react with the wafer surface. Oxygen can react with the wafer surface. Airborne Molecular Contaminants (primarily Hydrocarbons emitted by the plastics) can react with the wafer surface. For these reasons, the semiconductor industry is presently considering standards for purging FOUP enclosures with Nitrogen. There remains a need for a FOUP nitrogen purge technique that prevents over- or under pressurization and reliably couples and uncouples Nitrogen to a plastic FOUP enclosure.

Figure 13:
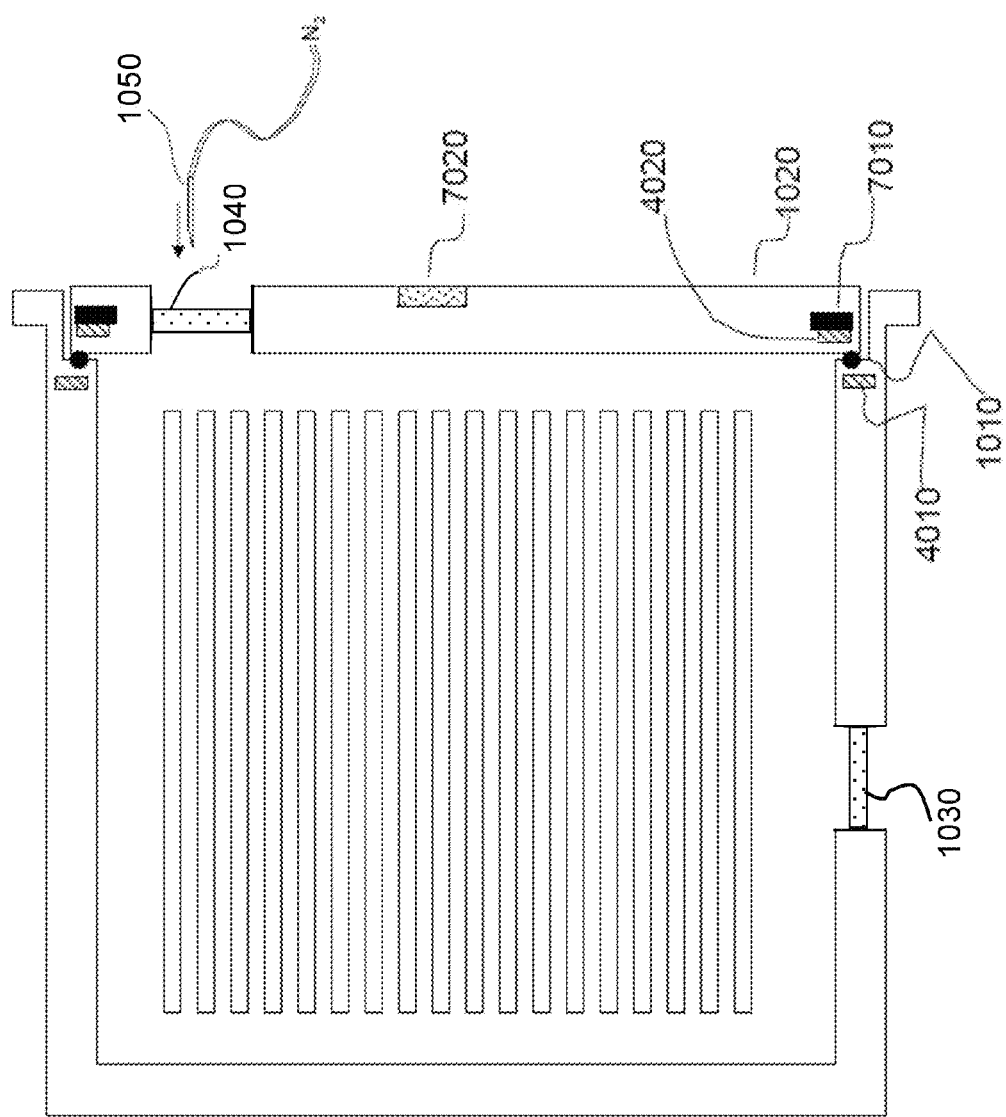
FIG. 13 depicts a magnetically sealed container with a nitrogen purge port.

FIG. 13 shows a nitrogen purging system for a FOUP. A FOUP 1000 may generally include a seal gasket 1010, a FOUP door 1020, and an exhaust permeable membrane 1030, which allows for small pressure differentials to exist while venting excess pressure through the membrane. An intake gasket 1040, which may be similar to gaskets used in pharmacy applications to remove liquid from vials, selectively receives a needle 1050 coupled to a nitrogen source. The needle 1050 may be movable under robotic or other electromechanical control to move into and out of the intake gasket 1040.

Figure 14:
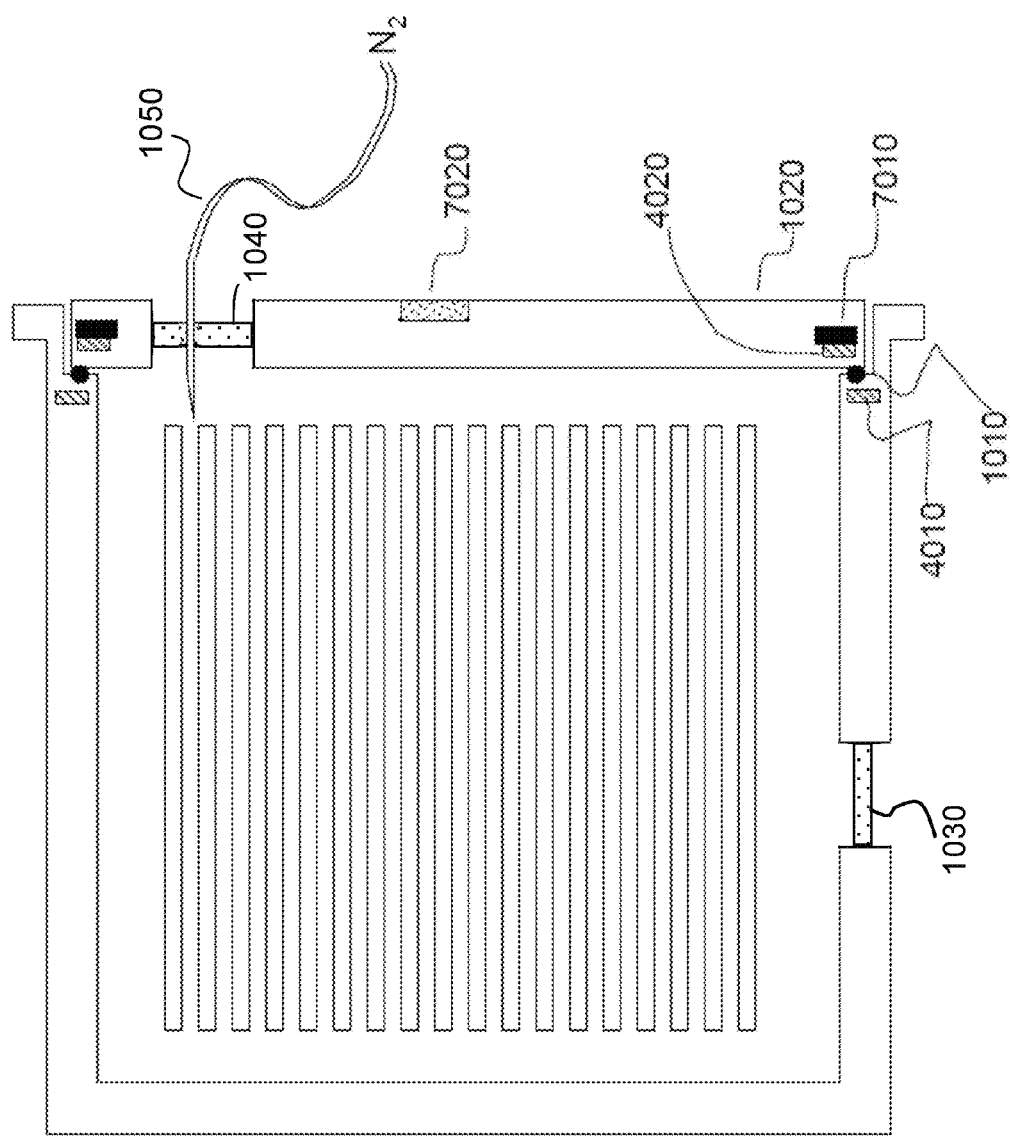
FIG. 14 depicts an application of the embodiment of FIG. 13.

FIG. 14 shows the needle 1050 of FIG. 9 inserted into the intake gasket 1040, after which nitrogen may be supplied through the needle 1050 into the FOUP 1000 interior to purge air or other gasses therefrom.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

All documents referenced herein are hereby incorporated by reference.

What is claimed is:

1. system for sealing a container, comprising:
   a plurality of moveable magnets disposed near a perimeter of a container door, at least one of the movable magnets having a mounting portion and an end portion disposed facing the container in both a sealed position and an open position;
   a linkage hub positioned within the perimeter of the container door; and
   a plurality of control linkages connecting each of the plurality of moveable magnets to the linkage hub so that operating the linkage hub causes the control linkages to move the moveable magnets, where the at least one moveable magnet is movably mounted to the container door at the mounting portion and the end portion of the at least one moveable magnet is moveable in a movement direction substantially parallel to a direction of insertion of the container door into the container between the sealed position and the open position so that a gap in the movement direction between the end portion, of the at least one movable magnet, facing the container in both the sealed position and the open position changes when the magnet is moved.

2. The system of claim 1, wherein operating the linkage hub comprises rotating the linkage hub.

3. The system of claim 2, wherein rotating the linkage hub clockwise causes the moveable magnets to move to the sealed position.

4. The system of claim 2, wherein rotating the linkage hub counter-clockwise causes the moveable magnets to move to the open position.

5. The system of claim 1, wherein the system for sealing a container is sealed within the container door.

6. The system of claim 1, wherein the linkage hub is magnetically attractive.

7. The system of claim 6, further including a magnet for positioning over the linkage hub and for operating the linkage hub via magnetic attraction of the magnet to the hub.

8. The system of claim 1, wherein the moveable magnets are disposed to provide an evenly distributed sealing force when the moveable magnets are positioned in the sealed position.

9. The system of claim 1, further including at least one return spring positioned to return the moveable magnets to the sealed position.

10. The system of claim 9, wherein the return spring acts on at least one of the plurality of magnets.

11. The system of claim 9, wherein the return spring acts on the linkage hub.

12. A system comprising:
    a plurality of moveable magnets disposed near a perimeter of a container door, at least one of the movable magnets having a mounting portion and an end portion disposed facing a container in both a sealing position and an open position;
    a magnet positioning mechanism connecting to each of the moveable magnets to control movement of the moveable magnets in relation to the sealing position;
    the container with an opening shaped to receive the door thereby closing the opening, where the at least one of the moveable magnet is movably mounted to the container door at the mounting portion and the end portion of the at least one moveable magnet is movable in a movement direction substantially parallel to a direction of insertion of the container door into the container so that a gap in the movement direction between the end portion, of the at least one movable magnet, facing the container in both the sealing position and open position changes when the magnet is moved; and
    a plurality of magnetically attractive elements disposed near the opening and positioned to form a magnetic seal with the moveable magnets when the moveable magnets are positioned at the sealing position.

13. The system of claim 12, wherein the magnet positioning mechanism includes a linkage hub connected to the plurality of moveable magnets with linkages.

14. The system of claim 12, wherein the magnet positioning mechanism includes a rotating hub for moving the moveable magnets to the sealed position in response to a clockwise rotation of the rotating hub.

15. The system of claim 12, wherein the magnet positioning mechanism includes a rotating hub for moving the moveable magnets from the sealed position in response to a counter-clockwise rotation of the rotating hub.

16. The system of claim 12, wherein the system sealing a container is sealed within the container door.

17. The system of claim 12, wherein the moveable magnets are disposed to provide an evenly distributed sealing force when the moveable magnets are positioned in the sealed position.

18. The system of claim 1, wherein the plurality of moveable magnets are pivotally disposed near the perimeter of the container door so that the end portion extends towards a perimeter of the door.

* * * * *

UNITED STATES PATENT AND TRADEMARK OFFICE
CERTIFICATE OF CORRECTION

PATENT NO. : 8,424,703 B2
APPLICATION NO. : 12/434330
DATED : April 23, 2013
INVENTOR(S) : Meulen Page 1 of 1

It is certified that error appears in the above-identified patent and that said Letters Patent is hereby corrected as shown below:

In the claims,

Column 7, Claim 1, Line 46, delete "system" and insert --A system-- therefor.

Signed and Sealed this
Fourteenth Day of April, 2015

Michelle K. Lee
*Director of the United States Patent and Trademark Office*